(12) United States Patent  
Marshall et al.

(10) Patent No.: US 6,998,904 B2  
(45) Date of Patent: Feb. 14, 2006

(54) CIRCUIT AND METHOD FOR TURN-ON OF AN INTERNAL VOLTAGE RAIL

(75) Inventors: Andrew Marshall, Dallas, TX (US); Wei Dong, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 16 days.

(21) Appl. No.: 10/803,581

(22) Filed: Mar. 17, 2004

(65) Prior Publication Data

US 2005/0206435 A1    Sep. 22, 2005

(51) Int. Cl.
*G05F 1/10*    (2006.01)
*G05F 3/02*    (2006.01)

(52) U.S. Cl. ..................................... 327/543
(58) Field of Classification Search ................ 327/538, 327/540–541, 543–544; 323/315
See application file for complete search history.

(56) References Cited

U.S. PATENT DOCUMENTS

| | | | | | |
|---|---|---|---|---|---|
| 6,163,206 | A | * | 12/2000 | Kobayashi | 327/540 |
| 6,249,174 | B1 | * | 6/2001 | Tsunezawa | 327/538 |
| 6,388,695 | B1 | * | 5/2002 | Nagumo | 347/237 |
| 2004/0104762 | A1 | * | 6/2004 | Nishi | 327/538 |

* cited by examiner

*Primary Examiner*—Quan Tra
(74) *Attorney, Agent, or Firm*—Alan K. Stewart; W. James Brady, III; Frederick J. Telecky, Jr.

(57) ABSTRACT

The circuit and method for turning on an internal voltage rail includes: coupling a first transistor between a power supply node and an internal voltage rail node; mirroring a current from a second transistor to the first transistor during a turn-on time period; and coupling a control node of the first transistor to a bias voltage node after the turn-on time period. This solution permits current controlled turn-on of the first transistor, but a fully switched-on first transistor once turn-on is complete.

9 Claims, 1 Drawing Sheet

CIRCUIT AND METHOD FOR TURN-ON OF AN INTERNAL VOLTAGE RAIL

FIELD OF THE INVENTION

The present invention relates to electronic circuitry and, in particular, to a circuit for turning on an internal voltage rail.

BACKGROUND OF THE INVENTION

Most prior art solutions, for current and voltage control during turn-on of a voltage source, limit current to a large switching transistor through a resistor or current source to the switching transistor. Some have additional capacitance to the source or drain to further slow the switching. However, this results in a constantly rising gate voltage, which does not allow for ideal turn on characteristics of the transistor. An alternative splits up the transistor into smaller sizes, and turns on one or more smaller transistors, and leaves the majority of the transistor off until the supply reaches its operating voltage. This has risks associated with the initial current spike that occurs through only a small part of the transistor area, causing electromigration and reliability risks.

SUMMARY OF THE INVENTION

A circuit and method for turning on an internal voltage rail includes: coupling a first transistor between a power supply node and an internal voltage rail node; mirroring a current from a second transistor to the first transistor during a turn-on time period; and coupling a control node of the first transistor to a bias voltage node after the turn-on time period. This solution permits current controlled turn-on of the first transistor, but a fully switched-on first transistor once turn-on is complete.

DETAILED DESCRIPTION OF PREFERRED EMBODIMENTS

Figure 1:
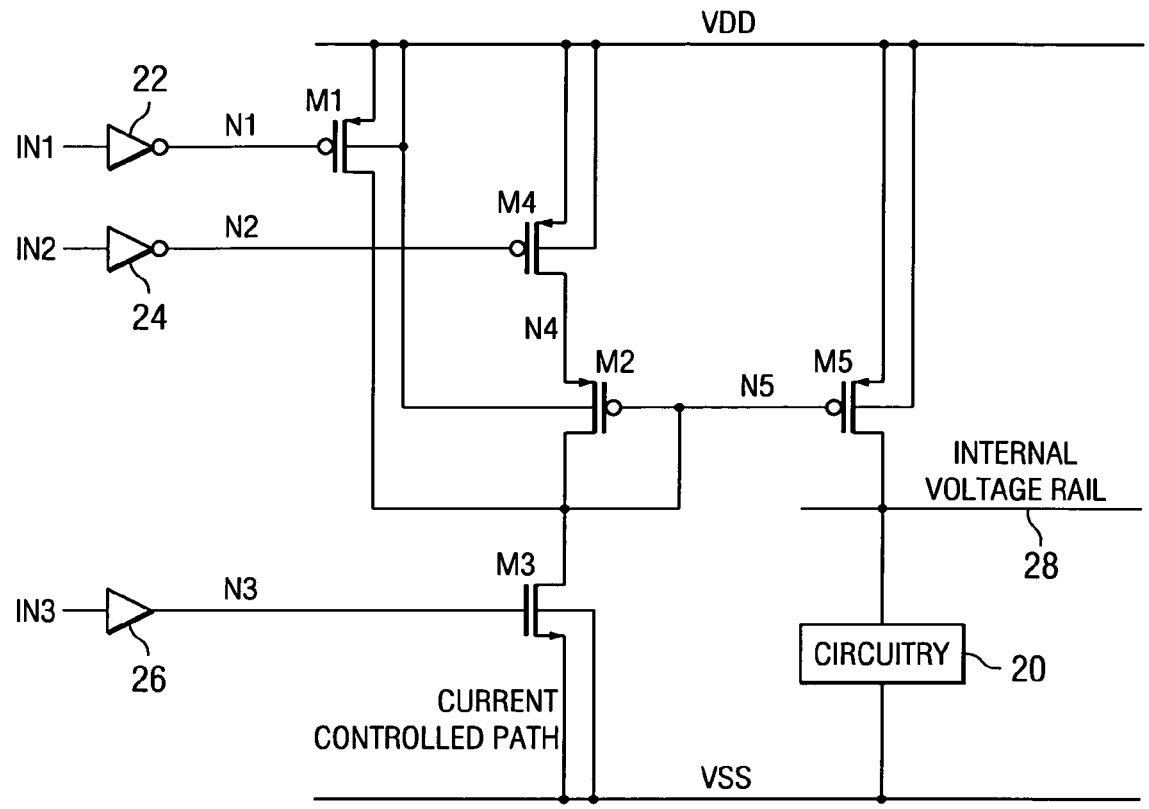
FIG. 1 is a schematic of a preferred embodiment circuit for turning on an internal voltage rail.
Figure 2:
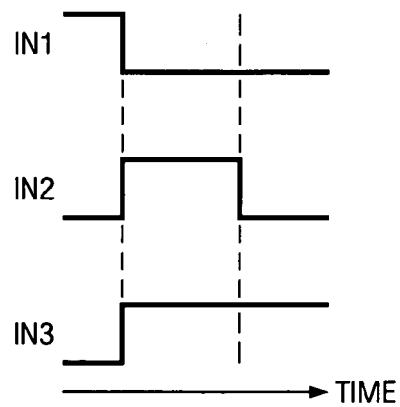
FIG. 2 is a plot of the inputs for the circuit of FIG. 2.

The solution according to the present invention permits current controlled turn-on of the transistor, but a fully switched-on transistor once turn-on is complete. A preferred embodiment circuit schematic is shown in FIG. 1. The circuit of FIG. 1 includes transistors M1 (PMOS), M2 (PMOS), M3 (NMOS), M4 (PMOS), and M5 (PMOS); internal circuitry 20; inverters 22 and 24; buffer 26; source voltages VDD and VSS; nodes N1–N5; internal voltage rail 28; and inputs IN1, IN2, and IN3. A plot of the inputs IN1, IN2, and IN3 is shown in FIG. 2.

The mode of operation is as follows: In the off state transistor M5 is off. This is achieved by input IN1 being high, forcing node N1 low and node N5, the gate of transistor M5, high, while input IN3 is low, forcing node N3 low and holding off transistor M3. The state of input IN2 can be either low or high, but might be preferentially low to force transistor M4 into the 'off' state for reduced off-state leakage. Since transistor M5 is off, the internal voltage rail floats low.

In order to turn the internal circuitry 20 on, transistor M5 is turned on. This is achieved by turning on transistor M3, a current controlled transistor (long channel; narrow width transistor, or a transistor in series with a current controlling element such as a resistor or current source). It is standard procedure to control turn on of a large transistor through controlled current supply, thus providing an RC or C/I time constant. However, this does not necessarily provide the most accurate time constants over temperature, and a controlled current turn-on is used in this invention. Transistor M3 is turned on, and transistor M1 is turned off. Also, transistor M4 is turned on (or remains on). This allows the mirroring of current between transistors M2 and M5, providing a controlled turn on of the internal rail voltage 28. Once the internal rail has turned on, transistor M4 is turned off, and the voltage at node N5 falls from a Vt (threshold voltage) below supply VDD to ground VSS, permitting full performance of transistor M5. If transistor M4 is turned off prematurely, transistor M5 will pull up rapidly at full strength.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit for turning on an internal voltage rail comprising:
    a first transistor coupled between a power supply node and an internal voltage rail node;
    a second transistor coupled to a control node of the first transistor;
    a third transistor coupled to the second transistor and having a control node coupled to the control node of the first transistor;
    a fourth transistor coupled between the second transistor and the power supply node;
    a fifth transistor coupled between the third transistor and the power supply node, wherein the third transistor is coupled between the second transistor and the fifth transistor;
    a first inverter coupled to a control node of the fourth transistor;
    a second inverter coupled to a control node of the fifth transistor; and
    a buffer coupled to a control node of the second transistor.

2. The circuit of claim 1 wherein the first, second, third, fourth, and fifth transistors are MOS transistors.

3. The circuit of claim 1 wherein the first, third, fourth, and fifth transistors are a first conductivity type, and the second transistor is a second conductivity type.

4. The circuit of claim 1 wherein the first, third, fourth, and fifth transistors are PMOS transistors, and the second transistor is an NMOS transistor.

5. The circuit of claim 1 further comprising internal circuitry coupled to the internal voltage rail node.

6. A method for turning on an internal voltage rail comprising:
    coupling a first transistor between a power supply node and an internal voltage rail node;
    mirroring a current from a second transistor to the first transistor during a turn-on time period;
    coupling a control node of the first transistor to a bias voltage node after the turn-on time period; and coupling a fourth transistor between the second transistor and the power supply node, wherein the fourth transistor is turned on during the turn-on time period and turned off after the turn-on time period.

7. The method of claim 6 wherein the bias voltage node is a ground node.

8. The method of claim 6 further comprising coupling a third transistor between the second transistor and the bias voltage node for coupling the control node of the first transistor to the bias voltage node.

9. The method of claim 6 further comprising coupling a fifth transistor between the third transistor and the power supply node, wherein the fifth transistor is turned off to allow the first transistor to turn on.

* * * * *